United States Patent
Honda et al.

(10) Patent No.: US 8,922,862 B2
(45) Date of Patent: Dec. 30, 2014

(54) MAGNETIC FORCE DRIVE DEVICE, OPTICAL SCANNING DEVICE, AND IMAGE DISPLAY DEVICE

(75) Inventors: Takeshi Honda, Tokyo (JP); Nobuaki Takanashi, Tokyo (JP)

(73) Assignee: NEC Corporation, Tokyo (JP)

( * ) Notice: Subject to any disclaimer, the term of this patent is extended or adjusted under 35 U.S.C. 154(b) by 140 days.

(21) Appl. No.: 13/642,039

(22) PCT Filed: Feb. 17, 2011

(86) PCT No.: PCT/JP2011/053359
§ 371 (c)(1),
(2), (4) Date: Oct. 18, 2012

(87) PCT Pub. No.: WO2011/118296
PCT Pub. Date: Sep. 29, 2011

(65) Prior Publication Data
US 2013/0063799 A1 Mar. 14, 2013

(30) Foreign Application Priority Data
Mar. 24, 2010 (JP) ................................. 2010-067877

(51) Int. Cl.
*G02B 26/08* (2006.01)
*G02B 26/10* (2006.01)
(Continued)

(52) U.S. Cl.
CPC .............. *H02K 33/16* (2013.01); *G02B 7/1821* (2013.01); *G02B 26/101* (2013.01); *G02B 27/104* (2013.01); *B81B 3/0032* (2013.01);
(Continued)

(58) Field of Classification Search
CPC .... G02B 26/085; G02B 26/10; G02B 26/101; G02B 26/105; G02B 7/1821; G02B 27/104; H02K 33/16; B81B 2201/041

USPC ........... 359/199.1, 199.3, 200.7, 201.2, 201.1
See application file for complete search history.

(56) References Cited

U.S. PATENT DOCUMENTS 6,897,990 B2 * 5/2005 Yagi et al. ................... 359/224.1
6,924,915 B2 * 8/2005 Hirose et al. ................ 359/199.3
(Continued)

FOREIGN PATENT DOCUMENTS

JP    62-260557 A    11/1987
JP    2-60453 A      2/1990
(Continued)

OTHER PUBLICATIONS

English Machine Translation of Japanese Patent Application JP 2006313216 A to Yasuda.*

(Continued)

*Primary Examiner* — Thomas K Pham
*Assistant Examiner* — Nicholas Pasko
(74) *Attorney, Agent, or Firm* — Sughrue Mion, PLLC

(57) ABSTRACT

A magnetic force drive device (7) has the first movable part (100) and the first driving unit (200). The first movable part (100) has the first movable plate (111), and a permanent magnet (120) that is magnetized in a direction substantially parallel to the first movable plate (111), and is supported by the first frame body (112) and the first pair of beam parts (113), so as to be able to oscillate around the Y axis, which is substantially parallel to the first movable plate (111) and substantially perpendicular to the direction in which the permanent magnet (120) is magnetized. The first driving unit (200) has a yoke (210), and a coil (220) that magnetizes the yoke (210). The yoke (210) has the first end part (211*a*), and a second end part (212*a*) that is placed on substantially the opposite side of the first end part (211*a*) against one magnetic pole of the permanent magnet (120). The first end part (211*a*) and second end part (212*a*) are magnetized in mutually different polarities, and drive the first movable part (100) in the same oscillation direction.

10 Claims, 10 Drawing Sheets

(51) Int. Cl.
*H02K 33/16* (2006.01)
*B81B 3/00* (2006.01)
*G02B 7/182* (2006.01)
*G02B 27/10*

(52) U.S. Cl.
CPC ..........................................................................
(2006.01) *G02B 26/085* (2013.01); *B81B 2201/042* (2013.01); *G02B 26/10* (2013.01); *G02B 26/105* (2013.01)
USPC .................. 359/199.3; 359/199.1; 359/200.7; 359/201.1; 359/201.2

(56) References Cited

U.S. PATENT DOCUMENTS

| | | | |
|---|---|---|---|
| 7,148,591 B2 * | 12/2006 | Mizoguchi et al. | 310/36 |
| 8,274,722 B2 * | 9/2012 | Moidu | 359/224.1 |
| 2008/0100898 A1 | 5/2008 | Kang et al. | |
| 2009/0039716 A1 * | 2/2009 | Ogawa et al. | 310/36 |
| 2009/0174922 A1 * | 7/2009 | Nanjyo et al. | 359/213.1 |
| 2010/0265556 A1 * | 10/2010 | Mizoguchi et al. | 359/199.3 |
| 2011/0310452 A1 * | 12/2011 | Lin | 359/200.7 |
| 2013/0229698 A1 * | 9/2013 | Honda et al. | 359/199.3 |

FOREIGN PATENT DOCUMENTS

| | | | |
|---|---|---|---|
| JP | 2005169553 A | | 6/2005 |
| JP | 2006171267 A | | 6/2006 |
| JP | 2006313216 A | * | 11/2006 |
| JP | 2007014130 A | * | 1/2007 |
| JP | 2007094109 A | | 4/2007 |
| JP | 2007152497 A | | 6/2007 |
| JP | 2008122955 A | | 5/2008 |

OTHER PUBLICATIONS

English Machine Translation of Japanese Patent Application JP 2007014130 A to Sasagawa.*

The international search report for PCT/JP2011/053359 mailed on May 24, 2011.

Japanese Office Action for JP Application No. 2012-506886 mailed on Sep. 9, 2014 with English Translation.

* cited by examiner

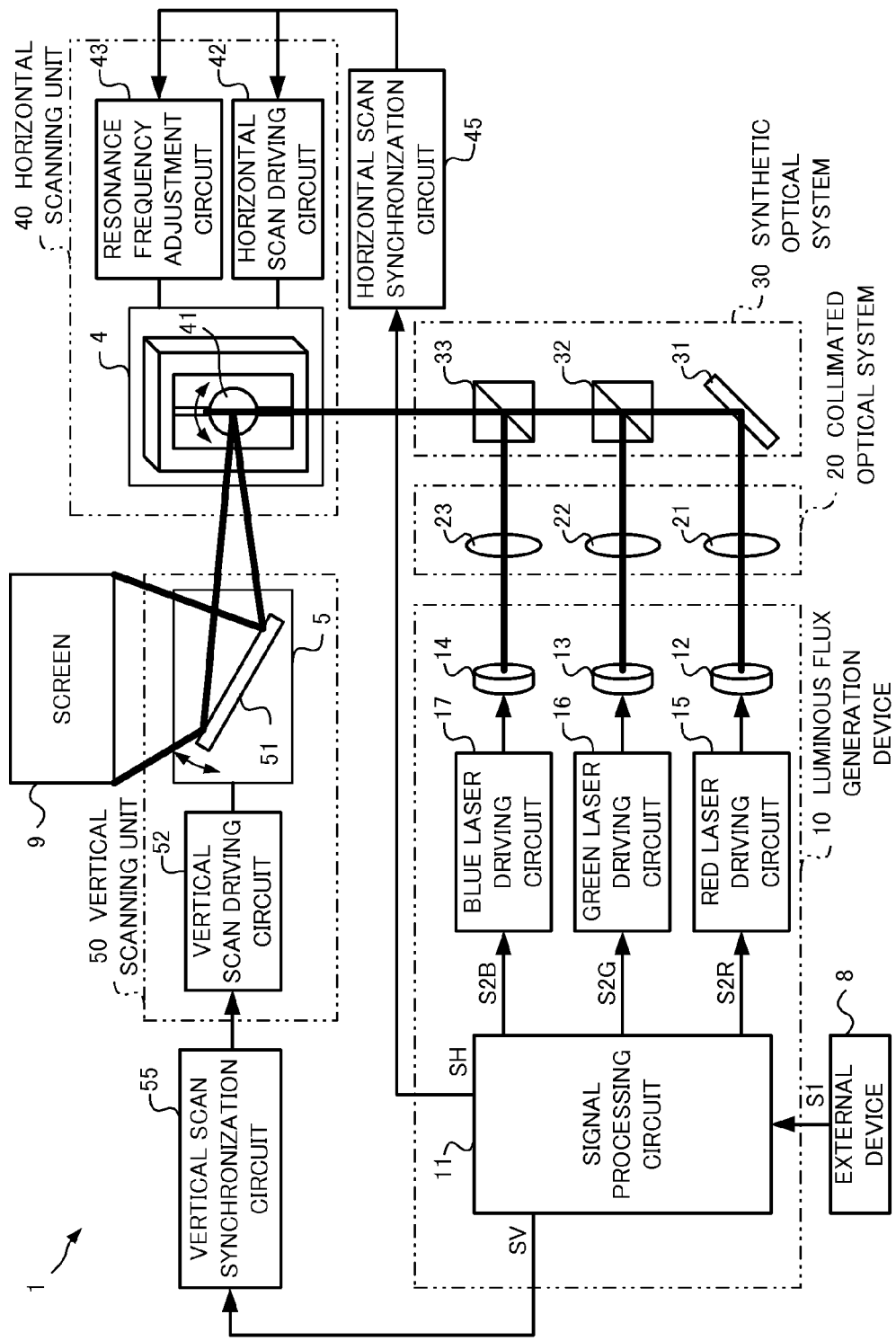

MAGNETIC FORCE DRIVE DEVICE, OPTICAL SCANNING DEVICE, AND IMAGE DISPLAY DEVICE

TECHNICAL FIELD

The present invention relates to a magnetic force drive device, an optical scanning device and an image display device.

BACKGROUND ART

Image display devices such as projection-type displays and so on generally use an optical scanning device that scans light. Conventionally, optical scanning devices of this kind have used a motor-driven polygon mirror, galvano mirror and so on.

Meanwhile, accompanying the advancement of micromachining technologies in recent years, optical scanning devices that make applied use of MEMS technology have developed significantly. Of this, optical scanning devices that scan light by making an optical scanning mirror oscillate back and forth by using a beam part as a rotating axis, have been gaining attention. This kind of optical scanning mirror is structured simple compared to a conventional motor-driven polygon mirror and so on and can be formed as one entity by semiconductor processing, so that there are advantages that this optical scanning mirror can be miniaturized, at lower cost, and furthermore this miniaturization makes possible higher speed, and so on.

An optical scanning mirror according to MEMS technology is generally driven by matching the resonance frequency of the structure and driving frequency, in order to increase the deflection angle (resonance drive).

Given that the torsional modulus of elasticity of the beam part is k and the inertia moment of the optical scanning mirror is $I_m$, the resonance frequency fr of the optical scanning mirror is given by following equation (1):

$$fr = 1/(2\pi) \cdot (k/I_m)^{1/2} \quad (1)$$

Given that the driving force that is applied to the optical scanning mirror is T, the deflection angle θ of the optical scanning mirror in resonance drive is given by following equation 2:

$$\theta = QT/k \quad (2)$$

In equation (2), Q is the quality factor of the system, typically having a value of approximately 100 in the air and typically having a value of approximately 1000 in a vacuum.

Consequently, it is possible to make an optical scanning mirror in resonance drive swing big by comparatively small driving force.

On the other hand, according to an optical scanning device of one kind, the above-described optical scanning mirror is driven without matching the resonance frequency of the structure and driving frequency (non-resonance drive).

The deflection angle θ of the optical scanning mirror in non-resonance drive is given by following equation (3):

$$\theta = T/k \quad (3)$$

According to equation (3), it is not possible to employ the quality factor Q, and therefore, compared to equation 2, the deflection angle θ of the optical scanning mirror is small. So, to increase the deflection angle θ of the optical scanning mirror, it is necessary to increase the driving force T or decrease the torsional modulus of elasticity k of the beam part. However, as derived from equation 1, making the torsional modulus of elasticity k of the beam part smaller results in making the resonance frequency fr of the optical scanning mirror lower. Then, there are also cases where, when the resonance frequency fr of the optical scanning mirror comes close to the driving frequency in non-resonance drive (normally 60 Hz), resonance mode overlaps the oscillating waveform of the optical scanning mirror. To prevent this, typically, it is necessary to set the resonance frequency fr of the optical scanning mirror to around 1 kHz. Consequently, to increase the deflection angle θ of the optical scanning mirror, it is preferable to increase the driving force T, rather than decrease the torsional modulus of elasticity k of the beam part.

As such optical scanning devices of non-resonance type, optical scanning devices using a magnetic force drive device are known.

For example, patent literatures 1 and 2 disclose optical scanning devices using a moving coil-type (MC-type) magnetic force drive device. These optical scanning devices mount a coil in an optical scanning mirror that is placed between a plurality of permanent magnets, and drive the optical scanning mirror utilizing the Lorentz force that is produced by applying a current to this coil.

Also, patent literatures 3 and 4 disclose optical scanning devices using a moving magnet-type (MM-type) magnetic force drive device. These optical scanning devices mount a permanent magnet on an optical scanning mirror and drive the optical scanning mirror by utilizing the magnetic interaction that is produced by applying a current to a coil that is placed near the optical scanning mirror.

PRIOR ART LITERATURE

Patent Literature

Patent Literature 1: Unexamined Japanese Patent Application Kokai Publication No. 2007-014130

Patent Literature 2: Unexamined Japanese Patent Application Kokai Publication No. 2008-122955

Patent Literature 3: Unexamined Japanese Patent Application Kokai Publication No. 2005-169553

Patent Literature 4: Unexamined Japanese Patent Application Kokai Publication No. 2007-094109

DISCLOSURE OF THE INVENTION

Problems to be Solved by the Invention

With the optical scanning devices of patent literatures 1 and 2, in order to increase the driving force that applies to the optical scanning mirror, it is necessary to increase the current to be applied to the coil or increase the number of turns in the coil. However, increasing the current to be applied to the coil raises a problem of damaging the optical performance of the optical scanning mirror due to the heat produced by the coil. Also, there is a limit to the number of turns in a coil according to the size of the optical scanning mirror, and, for example, it is difficult to mount a coil of 100 turns or more on a mirror of approximately 1 mm square. Consequently, it is difficult to increase the driving force to be applied to the optical scanning mirror.

Also, the optical scanning device of patent literature 3 adds, for example, a twist of placing two coils at an angle, which are provided below a permanent magnet, so that, even in a state an optical scanning mirror is tilted, enough magnetic field can be applied to the permanent magnet. However, since the interval between the end parts of the two coils is big, it is difficult to increase the magnetic field to be applied to the permanent magnet, and difficult to, for example, set the magnetic field to approximately 100 [Oe] or greater. Consequently, it is difficult to increase the driving force to be applied to the optical scanning mirror.

Also, with the optical scanning device of patent literature 4, it is possible to make the magnetic field to be applied to the permanent magnet comparatively big, by placing yokes so as to sandwich the permanent magnet. However, the post that is placed below the optical scanning mirror is a non-magnetic body, and therefore cannot contribute to the driving force to be applied to the optical scanning mirror. Also, to increase the driving force, it is necessary to place a coil outside the yokes as well as inside the yokes. Consequently, it is difficult to increase the driving force to be applied to the optical scanning mirror while reducing the size of the optical scanning device.

That is to say, with conventional magnetic force drive devices, it has been difficult to increase the driving force and increase the deflection angle of the movable part. So, with an optical scanning device using a magnetic force drive device, it has been difficult to increase the deflection angle of the optical scanning mirror mounted in the movable part. Also, with an image display device using an optical scanning device, it has been difficult to increase the scanning range of light and realizing making the device thinner and the screen bigger.

In view of the above backgrounds, an object of the present invention is to provide a magnetic force drive device in which the deflection angle of the movable part is big, and an optical scanning device and an image display device having this device.

Means for Solving the Problems

To achieve the above object, a magnetic force drive device according to the first aspect of the present invention includes:
a first movable part, having a first movable plate that is formed by a non-magnetic material, and a permanent magnet that is fixed to the first movable plate and magnetized in a direction that is substantially parallel to a main surface of the first movable plate;
a first frame body that is formed to surround a rim of the first movable part;
a first pair of beam parts that connects between the first frame body and the first movable plate, and that supports the first movable part to be able to rotate around a first axis, the first axis being substantially parallel to the main surface of the first movable plate and being substantially perpendicular to the direction in which the permanent magnet is magnetized; and
a first driving unit, having a yoke and a coil that magnetizes the yoke, and, in this magnetic force drive device:
the yoke has a first yoke unit that has a first end part placed near the permanent magnet, and a second yoke unit that has a second end part placed on an opposite side of the first end part, against one magnetic pole of the permanent magnet; and
the first end part and the second end part are magnetized in mutually different polarities, so as to drive the first movable part in a same oscillation direction.

Also, an optical scanning device according to a second aspect of the present invention includes:
the above-described magnetic force drive device; and
a mirror that is provided in the first movable part and reflects incident light.

Also, an image display device according to a third aspect of the present invention includes:

a luminous flux generation device that generates a modulated luminous flux; and
the above-described optical scanning device that reflects and scans the luminous flux.

According to the present invention, it is possible to provide a magnetic force drive device in which the deflection angle of the movable part is big, and an optical scanning device and an image display device having this device.

BRIEF DESCRIPTION OF DRAWINGS

FIG. 1 is a block diagram illustrating an image display device according to the first embodiment of the present invention;

MODE FOR CARRYING OUT THE INVENTION

Figure 2A:
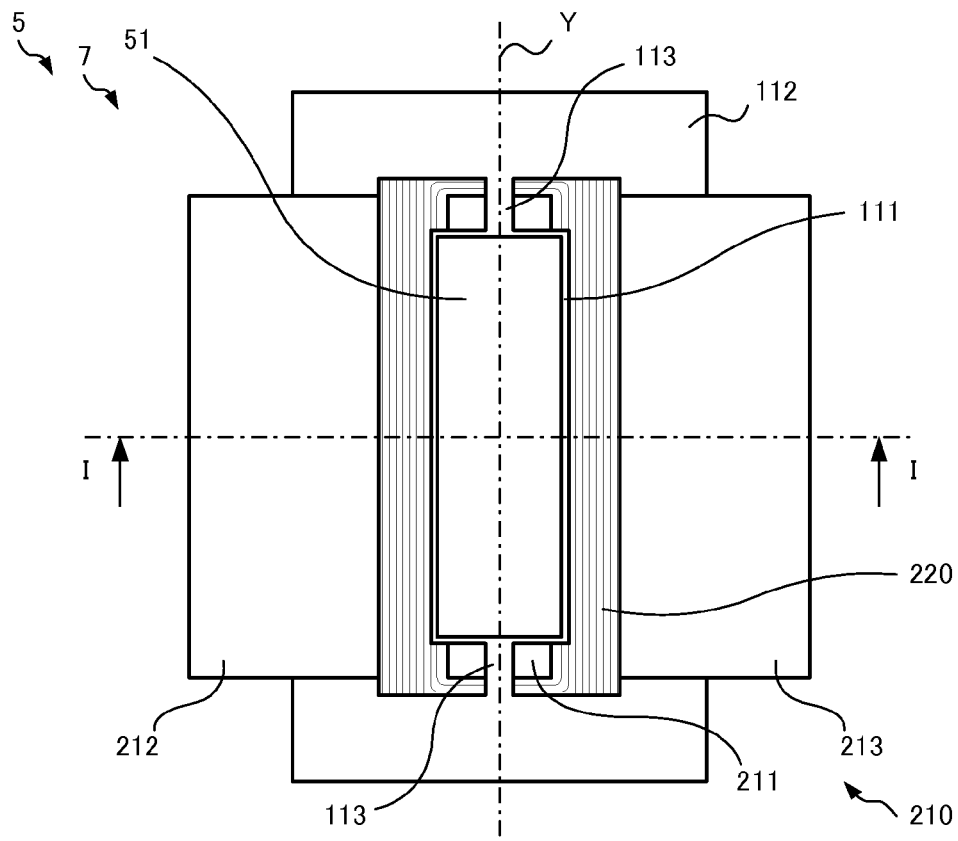
FIG. 2A is a top view illustrating the optical scanning device illustrated in FIG. 1.

Now, embodiments of the present invention will be described with reference to the accompanying drawings.
(First Embodiment)
First, an image display device 1 according to the first embodiment will be described with reference to FIG. 1. Note that the image display device 1 has an optical scanning device 5 of non-resonance type, formed with a magnetic force drive device 7 (see FIG. 2), which will be described later, and displays video, on a screen 9, by generating, synthesizing and scanning modulated red (R), green (G) and blue (B) luminous fluxes based on an image signal Si received as input from an external device 8.

The image display device 1 is formed with a luminous flux generation device 10, a collimated optical system 20, a synthetic optical system 30, a horizontal scanning unit 40, and a vertical scanning unit 50.

The luminous flux generation device 10 is formed mainly with a signal processing circuit 11, a red laser 12, a green laser 13, a blue laser 14, a red laser driving circuit 15, a green laser driving circuit 16, and a blue laser driving circuit 17.

The signal processing circuit 11 generates red, green and blue video signals S2R, S2G and S2B for generating red, green and blue luminous fluxes modulated according to the image signal S1 received as input from the external device 8, and outputs the generated red, green and blue video signals S2R, S2G and S2B to red, green and blue laser driving circuits 15, 16 and 17. Also, the signal processing circuit 11 generates horizontal and vertical synchronization signals SH and SV for synchronizing the operations of the horizontal and vertical scanning units 40 and 50 and the operations of the luminous flux generation device 10, and outputs the generated horizontal and vertical synchronization signals SH and SV to horizontal and vertical synchronization circuits 45 and 55, which will be described later.

The red, green and blue laser driving circuits 15, 16 and 17 drive the red, green and blue lasers 12, 13 and 14 according to the red, green and blue video signals S2R, S2G and S2B that are received as input from the signal processing circuit 11.

The red, green and blue lasers 12, 13 and 14 are formed with, for example, a semiconductor laser, a solid laser with a harmonic generation mechanism (SHG) and so on, generate modulated red, green and blue luminous fluxes according to the red, green and blue video signals S2R, S2G and S2B and output the generated red, green and blue luminous fluxes to the collimated optical system 20.

The collimated optical system 20 is formed with three collimator lenses 21, 22 and 23, makes the red, green and blue luminous fluxes that are incident from the luminous flux generation device 10 into parallel lights and outputs these to the synthetic optical system 30.

The synthetic optical system 30 is formed with three dichroic mirrors 31, 32 and 33 that reflect or allow to transmit the luminous fluxes in a wavelength selective fashion, synthesizes the red, green and blue luminous fluxes that are incident from the collimated optical system 20, and outputs the result to the optical scanning mirror 41 of the horizontal scanning unit 40, which will be described later.

The horizontal scanning unit 40 is formed with an optical scanning device 4 of resonance type, having an optical scanning mirror 41 for scanning the luminous fluxes that are incident from the synthetic optical system 30 in the horizontal direction, a horizontal scan driving circuit 42 for driving the optical scanning device 4, and a resonance frequency adjustment circuit 43 for adjusting the resonance frequency of the optical scanning device 4.

The vertical scanning unit 50 is formed with an optical scanning device 5 of non-resonance type, having an optical scanning mirror (hereinafter "mirror") 51 for scanning the luminous fluxes that are incident from the horizontal scanning unit 40, and a vertical scan driving circuit 52 for driving the optical scanning device 5.

The horizontal synchronization circuit 45 controls the horizontal scan driving circuit 42 and resonance frequency adjustment circuit 43, based on the horizontal synchronization signal SH that is received as input from the signal processing circuit 11, such that the operation of the horizontal scanning unit 40 synchronizes with the operation of the luminous flux generation device 10.

The vertical synchronization circuit 55 controls the vertical scan driving circuit 52, based on the vertical synchronization signal SV that is received as input from the signal processing circuit 11, such that the operation of the vertical scanning unit 50 synchronizes with the operation of the luminous flux generation device 10.

Next, the above-described optical scanning device 5 will be described in detail with reference to FIG. 2 and FIG. 3.

Figure 2B:
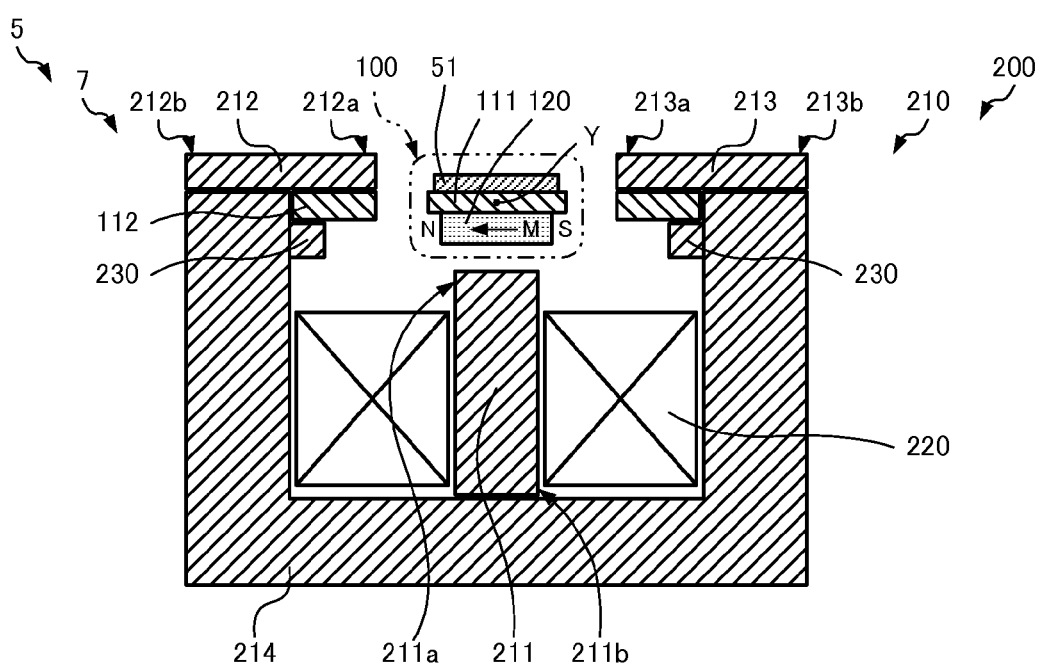
FIG. 2B is an I-I line cross-sectional view of FIG. 2A.

As illustrated in FIG. 2A and FIG. 2B, the optical scanning device 5 is formed with the above-described mirror 51 for reflecting incident light, and a magnetic force drive device 7 for driving the mirror 51.

The magnetic force drive device 7 is formed with the first movable plate 111, the first frame body 112, the first pair of beam parts 113 (see FIG. 2A), a permanent magnet 120 (see FIG. 2B), a yoke 210, and a coil 220. Note that, as illustrated in FIG. 2B, the first movable plate 111, the permanent magnet 120 and the mirror 51 form the first movable part 100. Also, the yoke 210 and the coil 220 form the first driving unit 200.

The first movable plate 111, the first frame body 112 and the first pair of beam parts 113 illustrated in FIG. 2A are, for example, a non-magnetic material substrate having adequate stiffness, such as a single-crystal silicon substrate, stainless and other metal substrate and so on, and are formed as one. The first movable plate 111 is formed in a rectangular plate shape having a predetermined width, depth and thickness. The first frame body 112 is formed in a rectangular frame shape to surround the rim of the first movable plate 111, and is supported by a support part 230, which will be described later. The first pair of beam parts 113 extends along the Y axis (the first axis), which is substantially parallel to the flat surfaces (the upper surface and lower surface) of the first movable plate 111, and connects between the first movable plate 111 and the first frame body 112.

The permanent magnet 120 illustrated in FIG. 2B is formed with, for example, a samarium-cobalt magnet, neodymium magnet and so on, formed in a rectangular plate shape having substantially the same width and depth as those of the first movable plate 111, and is fixed to the lower surface the first movable plate 111 by adhesive and so on. Then, the permanent magnet 120 is magnetized in a direction that is substantially parallel to the flat surfaces (the upper surface and lower surface) of the first movable plate 111 and that is substantially perpendicular to the Y axis, as represented by an arrow M.

The mirror 51 is, for example, silver alloy, aluminum alloy and so on, formed in a rectangular plate shape having substantially the same width and depth as those of the first movable plate 111, and is fixed to the upper surface of the first movable plate 111 by an adhesive and so on. Note that it is equally possible to form the mirror 51 in the form of a thin film, on the upper surface of the first movable plate 111, using, for example, the sputtering method and so on. Then, the upper surface of the mirror 51 is formed flat enough so as to have sufficient reflectivity for incident light.

The yoke 210 is formed by a magnetic material such as, for example, a steel material, ferrite material, permalloy material and so on, and is formed with the first yoke unit 211, a second yoke unit 212, a third yoke unit 213 and a fourth yoke unit 214. The first yoke unit 211 has one end part (hereinafter "first end part") 211a that is placed to face the lower surface of the permanent magnet 120. The second yoke unit 212 has one end part (hereinafter "second end part") 212a that is placed to face the N pole of the permanent magnet 120 on the opposite side of the first end part 211a. The third yoke unit 213 has one end part (hereinafter "third end part") 213a that is placed to face the S pole of the permanent magnet 120 on the opposite side of the first end part 211a. The fourth yoke unit 214 magnetically couples the opposite end part 211b of the first yoke unit 211, the opposite end part 212b of the second yoke unit 212 and the opposite end part 213b of third yoke unit 213. That is to say, the first to fourth yoke units 211 to 214 are magnetically coupled with each other and form one magnetic circuit. Note that a pair of support parts 230 that supports the above-described first frame body 112 is provided in the fourth yoke unit 214.

The coil 220 is wound around the first yoke unit 211 and is placed on the inner side the yoke 210 with respect to the width direction and the thickness direction. When a current is applied to the coil 220, the yoke 210 is magnetized, and, in each of the first end part 211a, second end part 212a, and third end part 213a, a magnetic pole appears. Here, the magnetic pole to appear in the first end part 211a has a different polarity from the magnetic poles that appear in the second end part 212a and third end part 213a.

Next, the operations of the above-described optical scanning device 5 will be described.

Figure 3A:
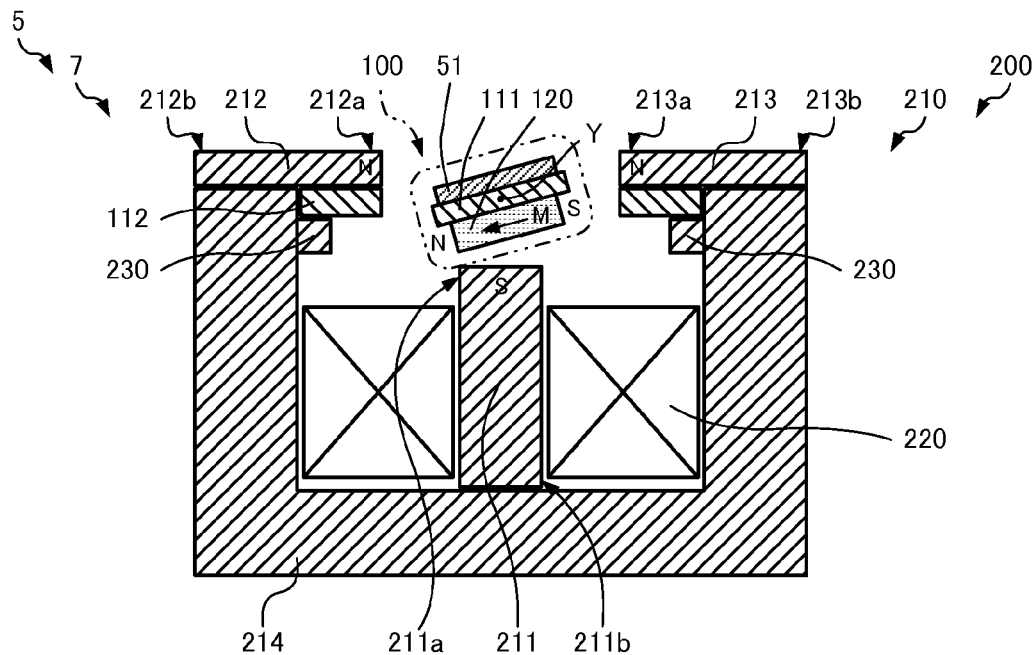
FIG. 3A is a cross-sectional view illustrating a left-polarized state of the optical scanning device illustrated in FIG. 2B.

In FIG. 2A, when a right-handed current is applied to the coil 220, as illustrated in FIG. 3A, magnetic field lines are produced from the first yoke 211 toward the second yoke 212 and third yoke 213, and an S pole is produced in the first end part 211a and an N pole is produced in the second end part 212a and third end part 213a. Then, the magnetic field that is produced between the first end part 211a and the second end part 212a works upon the N pole of the permanent magnet 120, and the magnetic field that is produced between the first end part 211a and the third end part 213a works upon the S pole of the permanent magnet 120, so that the first movable part 100 is tilted to the left (left-polarized state) around the Y axis, while causing torsion of the first pair of beam parts 103.

Figure 3B:
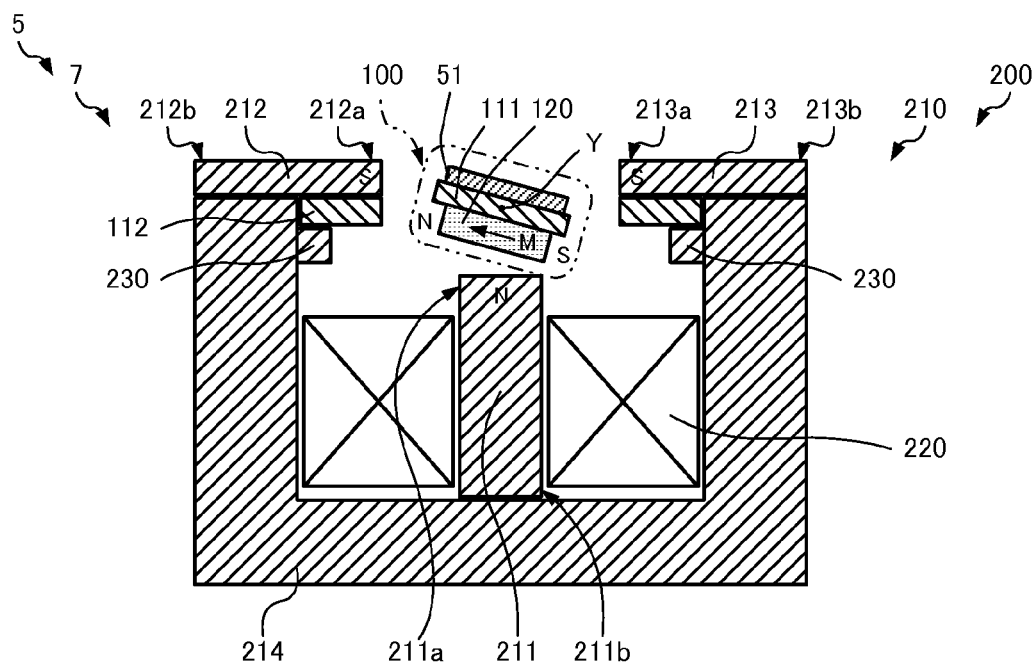
FIG. 3B is a cross-sectional view illustrating a right-polarized state of the optical scanning device illustrated in FIG. 2B.

Also, in FIG. 2A, when a left-handed current is applied to the coil 220, as illustrated in FIG. 3B, magnetic field lines are produced from the second yoke 212 and third yoke 213 toward the first yoke 211, and an N pole appears in the first end part 211a and an S pole appears in the second end part 212a and third end part 213a. Then, the magnetic field that is produced between the first end part 211a and the second end part 212a works upon the N pole of the permanent magnet 120, and the magnetic field that is produced between the first end part 211a and the third end part 213a works upon the S pole of the permanent magnet 120, so that the first movable part 100 is tilted to the right (right-polarized state) around the Y axis, while causing torsion of the first pair of beam parts 103.

Note that, to reduce the inertia moment of the first movable part 100 and by this means increase the deflection angle of the first movable part 100, the permanent magnet 120 is preferably designed approximately 1 mm thick or less. Also, in the event the current to be applied to the coil 220 has a predetermined frequency (for example, 60 Hz), to prevent resonance mode from being induced in the first movable part 100, the first pair of beam parts 113 is preferably designed such that the resonance frequency of the first movable part 100 is approximately 1 kHz.

With the magnetic force drive device 7 of the above configuration, by arranging the first end part 211a and second end part 212a of the yoke 210 to oppose each other sandwiching one magnetic pole (N pole) of the permanent magnet 120 and magnetizing the first end part 211a and second end part 212a of the yoke 210 to have mutually different magnetic poles, it is possible to increase the magnetic field to be applied to the permanent magnet 120, compared to conventional magnetic force drive devices. Consequently, it is possible to increase the driving force to be applied to the first movable part 100 and increase the deflection angle of the first movable part 100.

Furthermore, by arranging the first end part 211a and third end part 213a of the yoke 210 to oppose each other sandwiching the other magnetic pole (S pole) of the permanent magnet and magnetizing the first end part 211a and third end part 213a of the yoke 210 to have mutually different magnetic poles, it is possible to increase the magnetic field to be applied to the permanent magnet 120. Consequently, it is possible to further increase the driving force to be applied to the first movable part 100, and further increase the deflection angle of the first movable part 100.

Also, it is possible to easily reduce the gap between the first end part 211a and second end part 212a that oppose each other over the permanent magnet 120, as well as the gap between the first end part 211a and third end part 213a. By this means, the magnetic field to be applied to the permanent magnet 120 increase and the driving force to be applied to the first movable part 100 increases, so that it is possible to easily increase the deflection angle of the first movable part 100. Also, in the event there is a margin to the deflection angle of the first movable part 100, it is possible to, for example, miniaturize the magnetic force drive device 7 and reduce the power consumption of the magnetic force drive device 7.

Also, by magnetically coupling the first to third yokes 211 to 213 with each other and forming one magnetic circuit, it is possible to even more easily form the first driving unit 200. To be more specific, by winding the coil 220 only around the first yoke 211 and controlling the magnitude and direction of the current to be applied to the coil 220, it is possible to drive the first movable part 100. Also, by employing a configuration in which the coil 220 is placed only on the inner side of the yoke 210, it is possible to reduce the size of the driving unit 200 and miniaturize the magnetic force drive device 7.

Also, by mounting the mirror 51 on the first movable part 100 of the magnetic force drive device 7, it is possible to configure the optical scanning device 5 to have a big deflection angle of the mirror 51—that is to say, have a big scanning range of light.

Then, with the image display device 1 having the optical scanning device 5, the scanning range of light is big, so that it is possible to reduce the space (miniaturization and thinning), make the screen bigger and so on.

Now, the above-described optical scanning device 5 according to the first embodiment will be described in more detail based on an example of implementation.

The first movable part 100 of the optical scanning device 5 can be configured as follows, for example.

The first movable plate 111 is formed by a single-crystal silicon, and its width, depth and thickness are made 2 [mm], 6 [mm], and 100 [μm], respectively.

The permanent magnet 120 is made by a neodymium magnet, and its width, depth, thickness are made 2 [mm], 6 [mm] and 300 [μm], respectively.

The width, depth, and thickness of the mirror 51 are made 2 [mm], 6 [mm], and 50 [μm], respectively. Note that the mirror 51 is fixed to the upper surface of the first movable plate 111 by an adhesive.

The first pair of beam parts 113 is formed by a single-crystal silicon, and its dimensions are determined in accordance with the dimensions of the first movable plate 111, permanent magnet 120 and mirror 51 constituting the first movable part, so that the resonance frequency of the first movable part 100 becomes approximately 800 [Hz].

Also, the first driving unit 200 of the optical scanning device 5 can be configured, for example, as follows.

The gap between the first end part 211a and second end part 212a of the yoke 210, and the gap between the first end part 211a and third end part 213a of the yoke 210, are made 2 [mm].

The number of turns in the coil 220 is made 200. Also, the current to be applied to the coil 220 is made 200 [mA].

If the number of turns of the coil 220 is N, the current to be applied to the coil 220 is I [A], and the gap between the magnetic poles in the yoke 210 is g [m], the magnetic field H [A/m] that is produced between the magnetic poles in the yoke 210 is approximately given by following equation (4):

$$H = NI/g \quad (4)$$

With the present embodiment, according to equation (4), the magnetic field H that is produced between the first end part 211a and second end part 212a in the yoke 210, and between the first end part 211a and third end part 213a in the yoke 210, is approximately $2\times10^4$ [A/m]≈250 [Oe].

Also, given that the inertia moment of the first movable part 100 (the first movable plate 111, permanent magnet 120 and mirror 51) is I, the magnetic field to be applied to the permanent magnet 120 is H(t) (which is assumed to be uniform, for ease of explanation), the magnetic moment of the first movable part 100 is M (horizontal left-handed), the torsional modulus of elasticity in the first pair of beam parts 113 is $K_\theta$, the angle formed between the magnetic field H(t) (upward) and the vertical direction is $\theta_0$ (clockwise), and the tilt from the still position (horizontal) of the first movable part 100 is θ(t) (clockwise), the equation of motion of the first movable part 100 is given by following equation (5).

$$I \cdot (d^2/dt^2)\theta(t) + K_\theta \cdot \theta(t) - M \cdot H(t) \cdot \cos(\theta_0 - \theta(t)) = 0 \quad (5)$$

With the present embodiment, according to equation (5), the deflection angle θ of the first movable part 100 is approximately ±20 [°]. Consequently, the scanning range of light becomes approximately ±40 [°].

Also, with the present embodiment, given that the required magnitude of the magnetic field is comparatively low as approximately 250 [Oe], the power consumption of the coil 220 is comparatively low. In the event the current to be applied to the coil 220 has a predetermined frequency (for example, 60 [Hz]), although an impedance to match the inductance L is produced in the coil 220 in addition to the wire resistance, with the present embodiment, the impedance to be produced in the coil 220 is approximately 1 [Ω]. Consequently, in the event the current to be applied to the coil 220 is 200 [mA], the power consumption of the coil 220 is approximately 40 [mW] and is comparatively low.

As described above, according to the present embodiment, it is possible to make the gap between the first end part 211a and the second and third end parts 212a and 213a of the yoke 210 to the order of millimeters, so that the magnetic field to be produced in the gap between these is increased and the magnetic interaction between the permanent magnet 120 mounted on the first movable part 100 and the yoke 210 increases. Consequently, it is possible to increase the driving force that is applied to the first movable part 100 and increase the deflection angle of the mirror 51 mounted in the first movable part 100.

(Second Embodiment)

Next, an image display device and an optical scanning device 5A according to a second embodiment will be described. The image display device of the second embodiment has the same basic configuration as that of the image display device 1 of the first embodiment, but is different from the image display device 1 of the first embodiment in the configuration of the optical scanning device 5A. Consequently, with the present embodiment, the optical scanning device 5A will be described, and the image display device will not be described. Also, the configurations that are shared in common with the optical scanning device 5 will be assigned the same codes without further explanations.

Figure 4A:
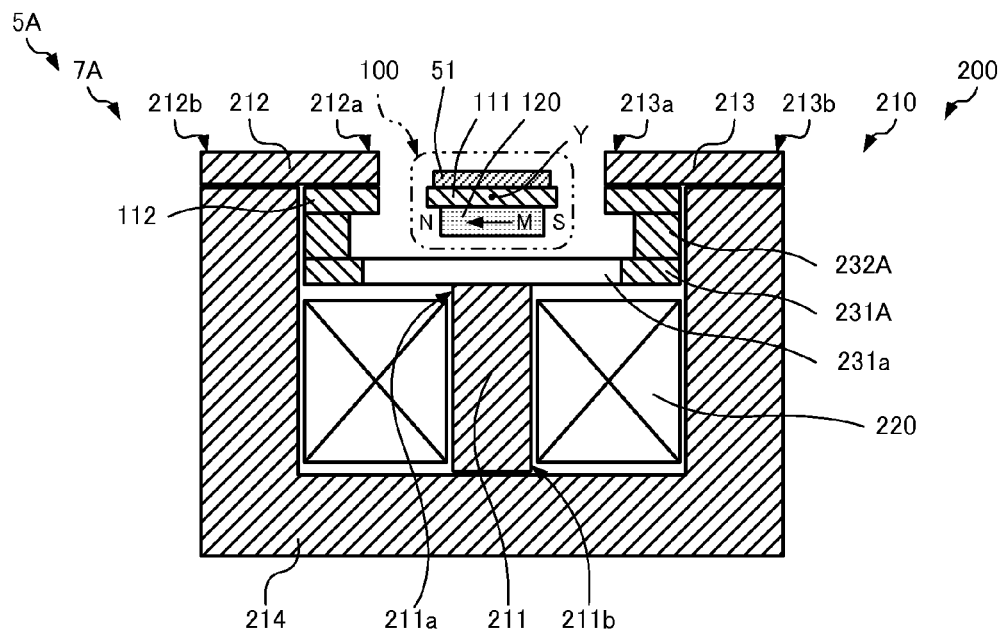
FIG. 4A is a cross-sectional view illustrating an optical scanning device according to a second embodiment of the present invention.

As illustrated in FIG. 4A, the optical scanning device 5A is different from the optical scanning device 5 of the first embodiment, in having a stopper 231A that is placed between the first yoke unit 211 and the permanent magnet 120, and a spacer 232A that is placed between the stopper 230A and the first frame body 112.

Figure 4B:
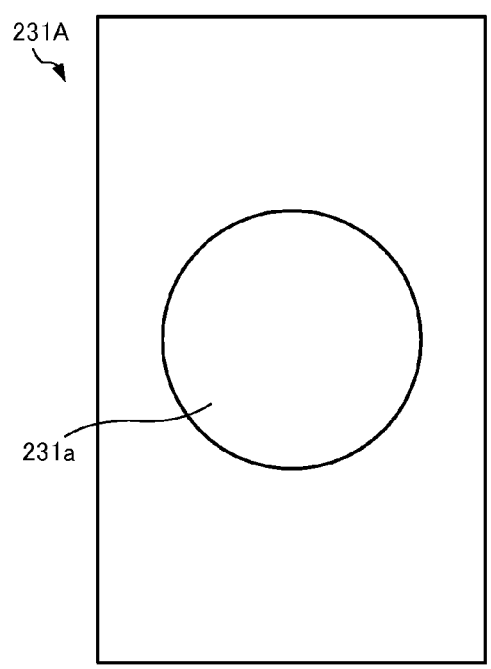
FIG. 4B is a top view illustrating the stopper illustrated in FIG. 4A.

The stopper 231A is formed by a non-magnetic material, and, as illustrated in FIG. 4B, is formed in a rectangular plate shape having a round hole 231a. As illustrated in FIG. 4A, the stopper 231A is supported by the first yoke unit 211 and fixed to the first yoke unit 211 by an adhesive and so on, and plays the role of forcibly stopping the vibration of the first movable part 100 at a predetermined angle. Note that the stopper 231A is formed by a non-magnetic material and therefore does not influence the magnitude of the magnetic field to be applied to the permanent magnet 120. Note that the round hole 231a is formed so as to check with the eye whether or not the permanent magnet 120 is correctly glued to the first movable plate 111 when a malfunction of the optical scanning device 5A occurs.

Figure 4C:
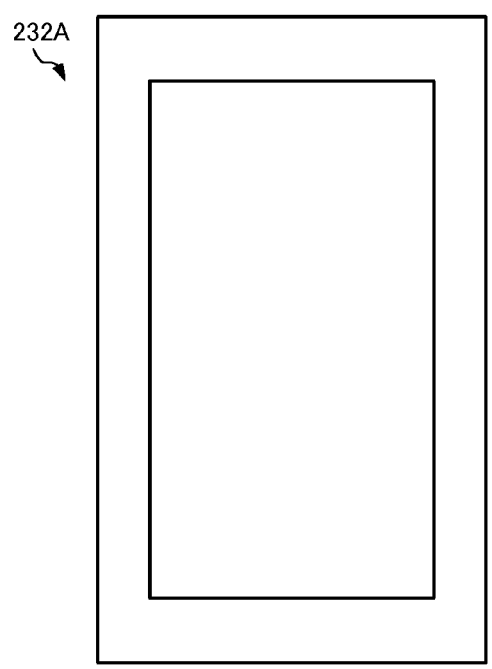
FIG. 4C is a top view illustrating the spacer illustrated in FIG. 4A.

The spacer 232A is formed by a non-magnetic material and, as illustrated in FIG. 4C, formed in a rectangular frame shape. As illustrated in FIG. 4A, the spacer 232A is supported by the stopper 231A, fixed to the stopper 231A by means of an adhesive, screw and so on, and plays the role of supporting the first frame body 112. The first frame body 112 is supported by the spacer 232A and fixed to the stopper 231A by means of an adhesive, screw and so on. Consequently, with the optical scanning device 5A of the present embodiment, support part 230, provided in the optical scanning device 5 of the first embodiment, is omitted.

Note that, to prevent damage of the mirror 51, the first pair of beam parts 103 and so on, the first movable part 100 (the first movable plate 111, the permanent magnet 120 and the mirror 51), the first frame body 112 and the first pair of beam parts 103 are preferably assembled into one entity with the spacer 232A and the stopper 231A, and later attached to the first driving unit 200.

According to the optical scanning device 5A of the above configuration, by providing the stopper 231A, it is possible to prevent the movable part 100 from swinging excessively and destroying the first pair of beam parts 113, for example. Consequently, it is possible to improve the reliability of the optical scanning device 5A.

The width, depth and the thickness of the first movable plate 111 can be made, for example, 2 [mm], 6 [mm] and 100 [μm], respectively. Also, the width, depth and thickness of the permanent magnet 120 can be made, for example, 2 [mm], 6 [mm] and 300 [μm], respectively. Also, the width, depth and thickness of the mirror 51 can be made, for example, 2 [mm], 6 [mm] and 50 [μm], respectively. Then, the thickness of the spacer 232A can be made, for example, 500 [μm]. By this means, the tilt of the first movable part 100 can be stopped at a position around ±10 [°].

(Third Embodiment)

Next, an image display device and an optical scanning device 5B according to a third embodiment will be described. The image display device of the third embodiment has the same basic configuration as that of the image display device 1 of the first embodiment, but is different from the image display device 1 of the first embodiment in the configuration of the optical scanning device 5B. Consequently, with the present embodiment, the optical scanning device 5B will be described, and the image display device will not be described. Also, the configurations that are shared in common with the optical scanning devices 5 and 5A of the first and second embodiments will be assigned the same codes without further explanations.

Figure 5A:
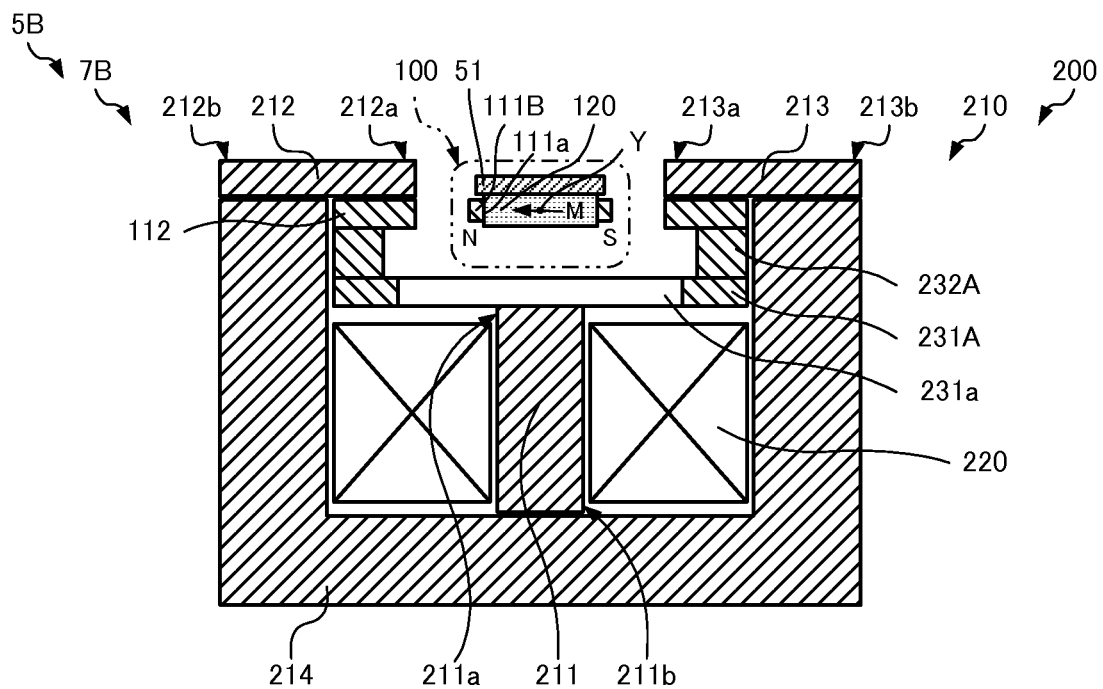
FIG. 5A is a cross-sectional view illustrating an optical scanning device according to a third embodiment of the present invention.

As illustrated in FIG. 5A, the optical scanning device 5B is different from the optical scanning device 5A of the second embodiment, primarily in that the first movable plate 111B and the permanent magnet 120 are engaged.

Figure 5B:
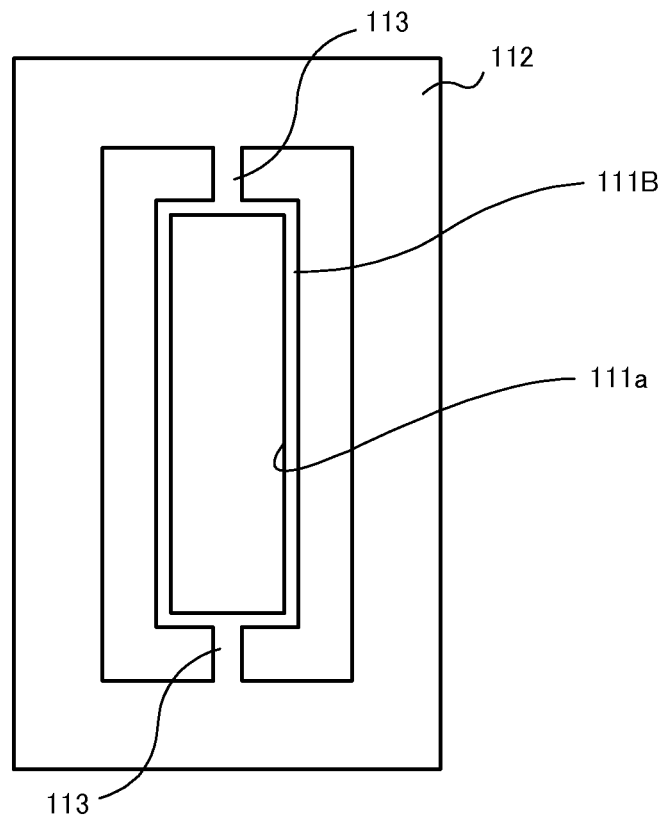
FIG. 5B is a top view illustrating the first movable plate illustrated in FIG. 5A.

As illustrated in FIG. 5B, the first movable plate 111B has a hole part 111a and is formed in a rectangular frame shape. As illustrated in FIG. 5A, the permanent magnet 120 is inserted and fitted in the hole part 111a of the first movable plate 111B and fixed by an adhesive and so on. Also, the mirror 51 is fixed to the upper surface of the permanent magnet 120 by an adhesive and so on. By this means, it is possible to arrange the first movable plate 111B, the permanent magnet 120 and the mirror 51, such that the center of gravity of the first movable part 100 substantially matches the Y axis, which is its oscillation axis.

With the optical scanning device 5B of the above configuration, it is possible to reduce the inertia moment of the first movable part 100 by substantially matching the center of gravity of the first movable part 100 and the Y axis, which is its oscillation axis. Consequently, it is possible to reduce the torsional modulus of elasticity of the first pair of beam parts 103 and also further increase the deflection angle of the mirror 51.

(Fourth Embodiment)

Next, an image display device and optical scanning devices 5C to 5F according to a fourth embodiment will be described. The image display device of the fourth embodiment has the same basic configuration as that of the image display device 1 of the first embodiment, but is different from the image display device 1 of the first embodiment in the configuration of the optical scanning devices 5C to 5F. Consequently, the optical scanning devices 5C to 5F of the present embodiment will be described, and the image display device will not be described. Also, the configurations that are shared in common with the optical scanning devices 5, 5A and 5B of the first through third embodiments will be assigned the same codes without further explanations.

As illustrated in FIG. 6 to FIG. 9, the optical scanning devices 5C to 5F are different from the optical scanning device 5A of the second embodiment, in that at least one of the first, second and third end parts 211a, 212a and 213a of the yokes 210C to 210F is sharpened.

Figure 6:
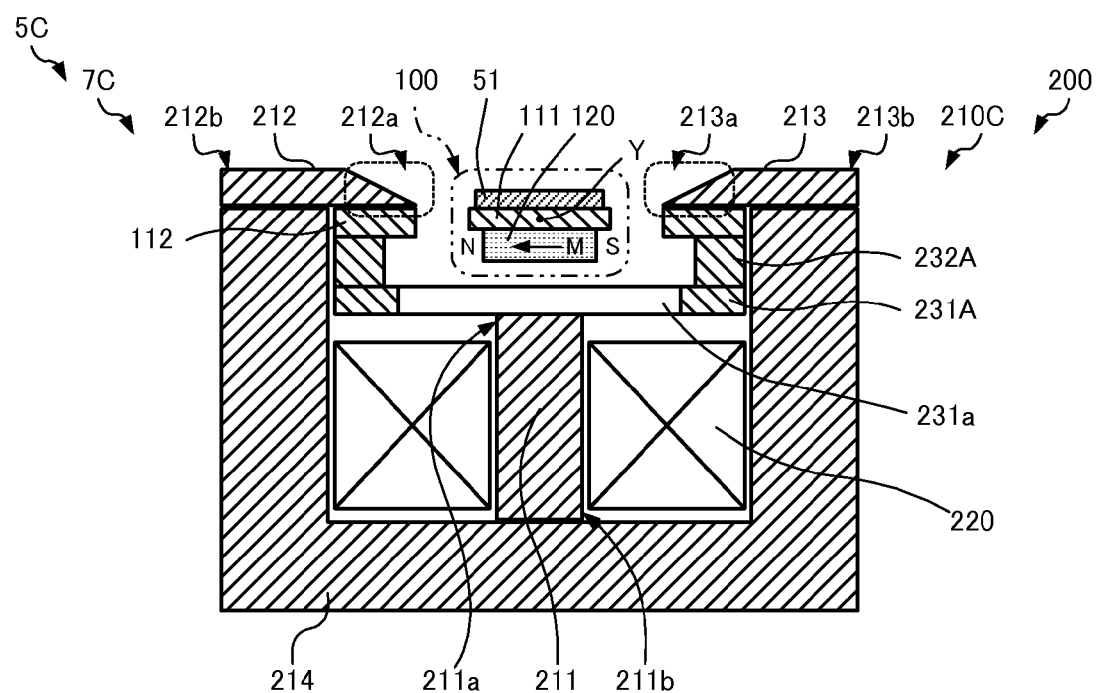
FIG. 6 is a cross-sectional view illustrating an optical scanning device according to a fourth embodiment of the present invention.

With the optical scanning device 5C illustrated in FIG. 6, the second and third end parts 212a and 213a of the yoke 210C are sharpened toward one and the other magnetic poles (N pole and S pole) of the permanent magnet 120.

Figure 7:
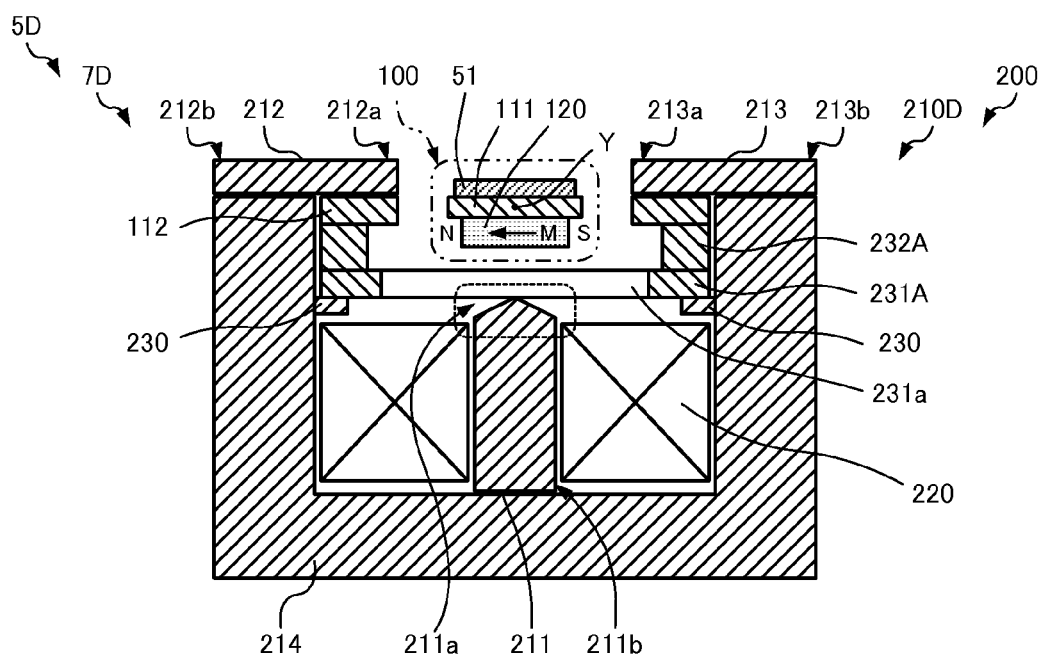
FIG. 7 is a cross-sectional view illustrating the optical scanning device according to the fourth embodiment of the present invention.

With the optical scanning device 5D illustrated in FIG. 7, the first end part 211a of the yoke 210D is sharpened approximately toward the center of one and the other magnetic poles of the permanent magnet 120.

Figure 8:
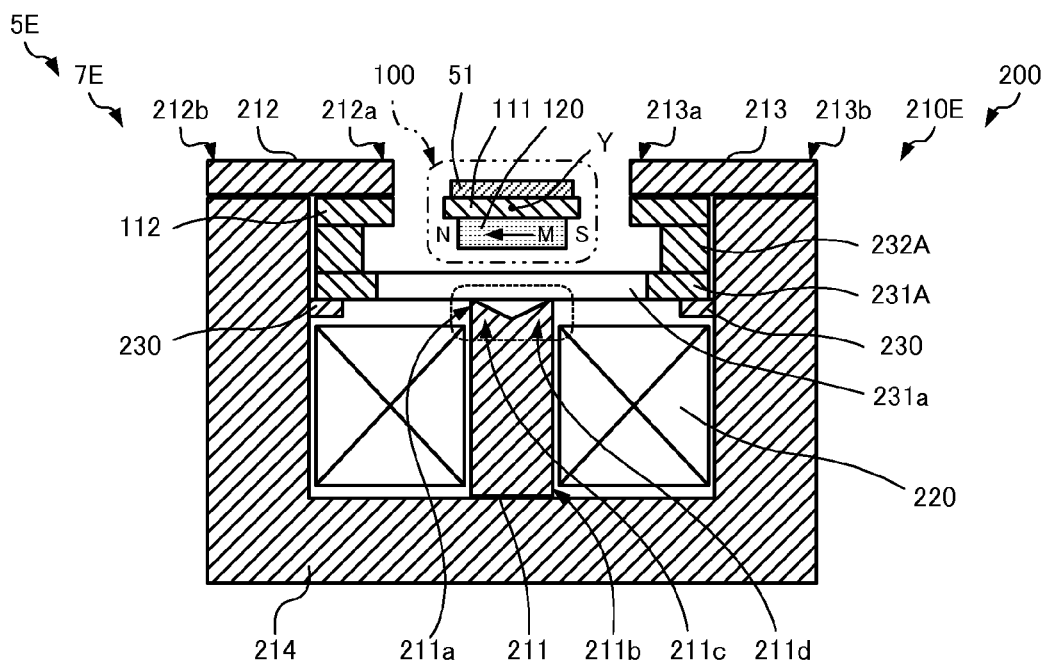
FIG. 8 is a cross-sectional view illustrating the optical scanning device according to the fourth embodiment of the present invention.

In the scanning device 5E illustrated in FIG. 8, two sharp projections 211c and 211d are formed in the first end part 211a of the yoke 210, toward one and the other magnetic poles (N pole and S pole) of the permanent magnet 120, respectively.

Figure 9:
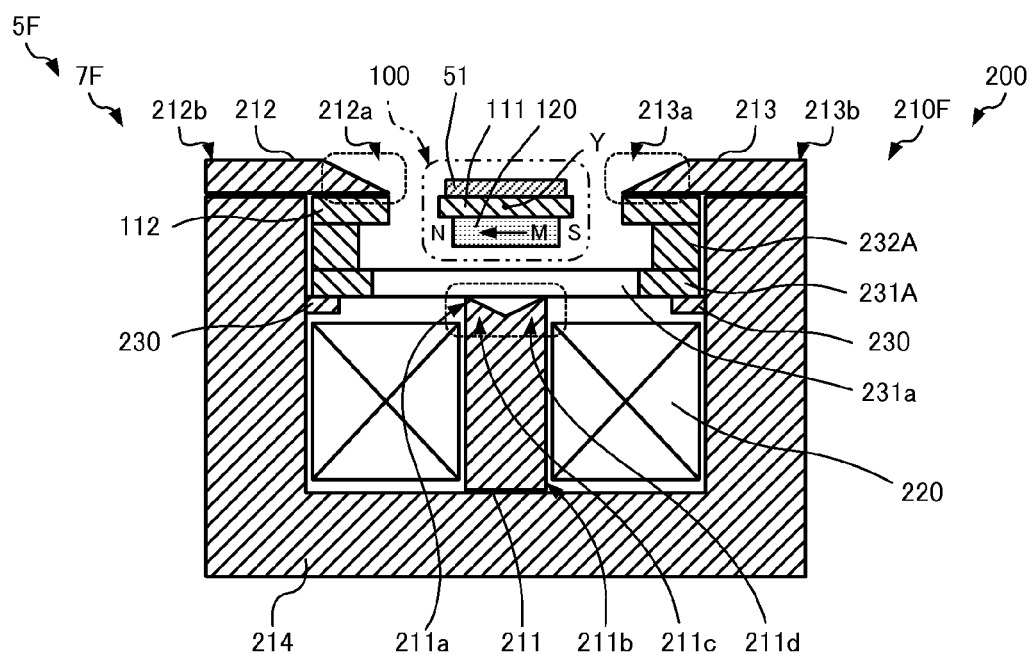
FIG. 9 is a cross-sectional view illustrating the optical scanning device according to the fourth embodiment of the present invention.

With the optical scanning device 5F illustrated in FIG. 9, the first to third end parts 211a to 213a of the yoke 210F are sharpened.

Note that, with the optical scanning devices 5D to 5F illustrated in FIG. 6 to FIG. 9, since the first end parts 211a of the yokes 210D to 210F are formed sharp, to support the stopper 231, the support part 230 shown in the first embodiment is provided.

With the optical scanning devices 5C to 5F of the above configuration, by sharpening at least one of the first, second and third end parts 211a, 212a and 213a of the yokes 210C to 210F, it is possible to increase the magnetic flux density in that end part and increase the magnetic field to be applied to the magnetic poles of the permanent magnet 120. As a result of this, it is possible to increase the driving force to be applied to the first movable part 100 and increase the deflection angle of the mirror 51.

Note that, although one of the first, second and third end parts 211a, 212a and 213a has a sharp cross section with the fourth embodiment, the first, second and third end parts of the present invention are by no means limited to this and may be formed to have, for example, an uneven and irregular cross section as long as the area of the cross-section becomes smaller nearer the permanent magnet.

(Fifth Embodiment)

Next, an image display device and an optical scanning device 5G according to a fifth embodiment will be described. Although the image display device 1 of the first embodiment has been described to include optical scanning devices 4 and 5 that are provided in the horizontal and vertical scanning units 40 and 50, the image display device of the fifth embodiment is different from the image display device 1 of the first embodiment in having a single, two-axis type optical scanning device 5G, instead of the optical scanning devices 4 and 5 of the image display device 1. Consequently, the optical scanning devices 5G of the present embodiment will be described, and the image display device will not be described. Also, the configurations that are shared in common with the optical scanning devices 5, and 5 to 5F of the first through fourth embodiments will be assigned the same codes without further explanations.

Figure 10A:
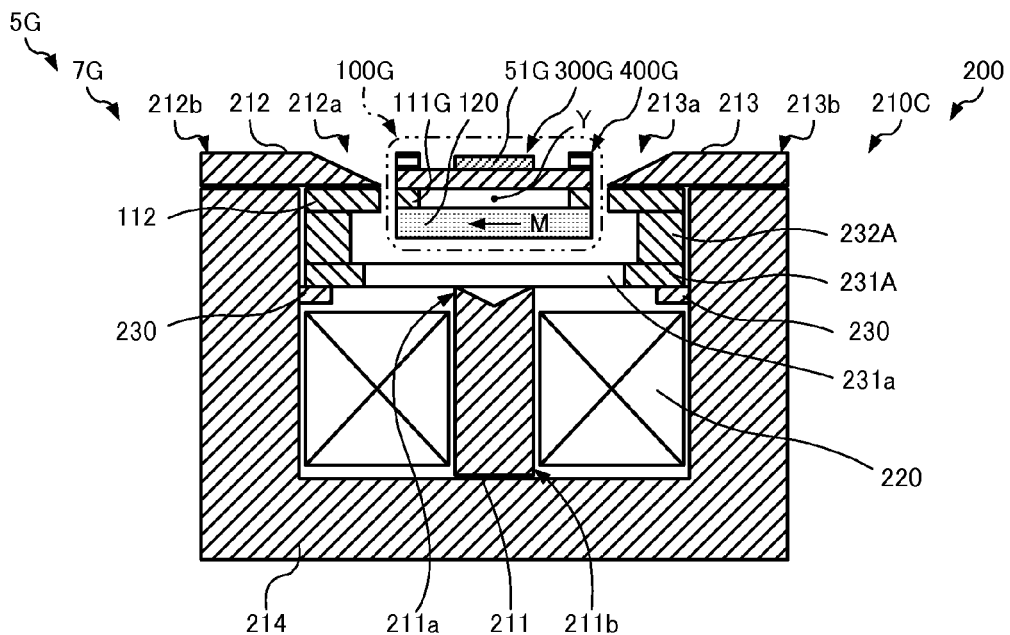
FIG. 10A is a cross-sectional view illustrating an optical scanning device according to a fifth embodiment of the present invention.

As illustrated in FIG. 10A, the optical scanning device 5G is the same as the optical scanning device 5C of the fourth embodiment except for the configuration of the first movable part 100G.

Figures 10B, 10C:
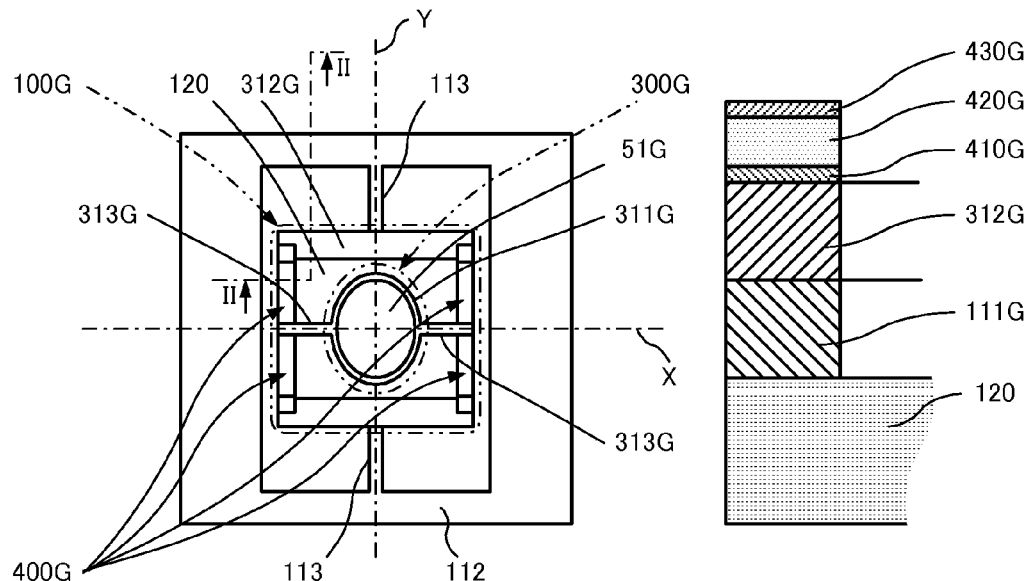
FIG. 10B is a top view illustrating the first movable part, second movable part and second driving unit illustrated in FIG. 10A.
FIG. 10C is a II-II line cross-sectional view of FIG. 10B.

The first movable part 100G has the first movable plate 111G, a permanent magnet 120, a second movable part 300G, and a second driving unit 400G. The second movable part 300G is formed with a second movable plate 311G and a mirror 51G, as illustrated in FIG. 10B. Also, the first movable part 100G further has a second frame body 312G and a second pair of beam parts 313G.

The second movable plate 311G, second frame body 312G and second pair of beam parts 313G are formed by a non-magnetic material substrate that allows micromachining and that has adequate stiffness such as, for example, a single-crystal silicon substrate, and are formed as one. Also, these structures may be formed by a metal substrate such as stainless, instead of a single-crystal silicon substrate. The second movable plate 311G is formed in an elliptical plate shape having a predetermined long side and short side. The second frame body 312G is formed in a rectangular frame shape to surround the rim of the second movable plate 311G. The second pair of beam parts 313G extends along the X axis (second axis) that is substantially parallel to the flat surfaces (upper surface and lower surface) of the second movable plate 311G and that is substantially perpendicular to the Y axis, and connects between the second movable plate 311G and the second frame body 312G. Then, the second frame body 312G is laminated over the upper surface of the first movable plate 111G, as illustrated in FIG. 10C. Note that the first movable plate 111G is formed in a rectangular frame shape so that the vibration of the second movable part 300 is tolerated.

The mirror 51G is, for example, silver alloy, aluminum alloy and so on, formed in an elliptical plate shape having substantially the same long side and short side as those of the second movable plate 311G, as illustrated in FIG. 10B, and is fixed to the upper surface of the second movable plate 311G by an adhesive and so on. Note that it is equally possible to form the mirror 51G in the form of a thin film, on the upper surface of the second movable plate 311G, using, for example, the sputtering method and so on. Then, the upper surface of the mirror 51 is formed flat enough so as to have sufficient reflectivity for incident light.

The second movable part 300G (the second movable plate 311G and the mirror 51G) and the second pair of beam parts 313G are designed such that the second movable part 300G has a predetermined resonance frequency.

As illustrated in FIG. 10C, the second driving unit 400G is formed with a laminated body of a lower electrode 410G, a piezoelectric element 420G, and an upper electrode 420G, and is formed on the upper surface of the second frame body 312G via an oxide film (not illustrated). The piezoelectric element 420G is directed to be distorted in a direction that is substantially parallel to the X axis by application of voltage. Note that an electrode pad (not illustrated) that is formed by, for example, an Al (aluminum) thin film, is formed on the upper surface of the upper electrode 430G. The electrode pad is formed a masking film using, for example, the sputtering method. Also, the lower electrode 410G is formed to have a part (not illustrated) where the piezoelectric element 420G is not laminated, and, like the upper electrode 430G, an electrode pad (not illustrated) is formed on its upper surface. Note that the electrode pad is by no means limited to Al and may be formed a film from other materials such as Pt (platinum), as long as sufficient adhesion and conductivity with a silicon substrate can be achieved. Also, the sputtering method is by no means limiting, and a film may be formed by other methods as well.

Next, the operation of the optical scanning device 5G will be described.

When an alternating voltage is applied between the lower electrode 410G and the upper electrode 430G via an electrode pad, the piezoelectric element 420G produces vibration in a direction that is substantially parallel to the X axis. Then, the piezoelectric element 420G is designed in an adequate shape and arrangement, so that torsional vibration is induced in the second pair of beam parts 313G. By this means, it is possible to vibrate the second movable part 300G around the X axis. Furthermore, by matching the frequency (driving frequency) of the alternating voltage and the resonance frequency of the second movable part 300G, it is possible to induce resonance mode in the second movable part 300G and increase the deflection angle of the second movable part 300G.

Also, like the first embodiment, the first movable part 100G where the second movable part 300G is mounted is able to drive around the Y axis by applying a current to the coil 220 of the first driving unit 200.

With the optical scanning device 5G of the above configuration, it is possible to drive the second movable part 300G mounting the mirror 51G around the X axis and the Y axis, which are perpendicular to each other. Consequently, it is possible to scan light two dimensionally using a single mirror 51G.

Then, an image display device having the optical scanning device 5G can be miniaturized, at low cost, compared to the image display device 1 of the first embodiment having two optical scanning devices 4 and 5.

Note that, although the second driving unit 400G is configured to drive the second movable part 300G utilizing the piezoelectric effect of the piezoelectric element 420G, the second driving unit of the present invention is by no means limited to this, and may be, for example, configured to drive the second movable part 300G utilizing electromagnetic force or electrostatic force.

The present invention is by no means limited to the above-described embodiments and examples, and it is clear and obvious that each of the embodiments and examples above can be modified as appropriate within the technical scope of the present invention.

Part or the entirety of the above embodiments may be described as in the following supplementary notes, but are by no means limited to the following:

(Supplementary Note 1)

A magnetic force drive device comprising:

a first movable part, having a first movable plate that is formed by a non-magnetic material, and a permanent magnet that is fixed to the first movable plate and magnetized in a direction that is substantially parallel to a main surface of the first movable plate;

a first frame body that is formed to surround a rim of the first movable part;

a first pair of beam parts that connects between the first frame body and the first movable plate, and that supports the first movable part to be able to rotate around a first axis that is substantially parallel to the main surface of the first movable plate and that is substantially perpendicular to the direction in which the permanent magnet is magnetized; and a first driving unit, having a yoke and a coil that magnetizes the yoke, wherein:

the yoke has a first yoke unit that has a first end part placed near the permanent magnet, and a second yoke unit that has a second end part placed on an opposite side of the first end part, against one magnetic pole of the permanent magnet; and the first end part and the second end part are magnetized in mutually different polarities, so as to drive the first movable part in a same oscillation direction.

(Supplementary Note 2)

The magnetic force drive device according to Supplementary note 1, in which:

the yoke further has a third yoke unit having a third end part placed on a substantially opposite side of the first end part against the other magnetic pole of the permanent magnet; and the first end part and the third end part are magnetized in mutually different polarities, so as to drive the first movable part in the same oscillation direction.

(Supplementary Note 3)

The magnetic force drive device according to Supplementary note 1, in which the first and second yoke units are magnetically coupled with each other and configure a magnetic circuit.

(Supplementary Note 4)

The magnetic force drive device according to Supplementary note 2, in which the first, second and third yoke units are magnetically coupled with each other and configure a magnetic circuit.

(Supplementary note 5)

The magnetic force drive device according to any one of Supplementary notes 1 and 3, in which at least one of the first and second end parts is formed sharp toward the permanent magnet.

(Supplementary Note 6)
The magnetic force drive device according to any one of Supplementary notes 2 and 4, in which at least one of the first, second and third end parts is formed sharp toward the permanent magnet.

(Supplementary Note 7)
The magnetic force drive device according to any one of Supplementary notes 1 to 6, in which the first end part is formed to include a plurality of projections.

(Supplementary Note 8)
The magnetic force drive device according to any one of Supplementary notes 1 to 7, in which:
in the first movable plate, a hole part to place the permanent magnet is formed; and
the permanent magnet is placed in the hole part so that a center of gravity of the first movable part substantially matches the first axis.

(Supplementary Note 9)
The magnetic force drive device according to any one of Supplementary notes 1 to 8, in which a stopper of a plate shape, formed by a non-magnetic material and limiting oscillation of the first movable part at a predetermined angle, is placed between the first end part and the first movable part.

(Supplementary Note 10)
The magnetic force drive device according to Supplementary note 9, in which a spacer that is formed by a non-magnetic material is placed between the stopper and the first frame body.

(Supplementary Note 11)
The magnetic force drive device according to any one of Supplementary notes 1 to 10, in which the coil is wound only around the first yoke unit.

(Supplementary Note 12)
The magnetic force drive device according to any one of Supplementary notes 1 to 11, in which the first movable plate, the first frame body and the first pair of beam parts are formed as one by a single-crystal silicon substrate.

(Supplementary Note 13)
The magnetic force drive device according to any one of Supplementary notes 1 to 11, in which the first movable plate, the first frame body and the first pair of beam parts are formed as one by a metal substrate.

(Supplementary Note 14)
The magnetic force drive device according to any one of Supplementary notes 1 to 11, in which the first movable plate, the first frame body and the first pair of beam parts are formed as one by a stainless substrate.

(Supplementary Note 15)
The magnetic force drive device according to any one of Supplementary notes 1 to 14, in which the thickness of the permanent magnet is 1 mm or less.

(Supplementary Note 16)
The magnetic force drive device according to any one of Supplementary notes 1 to 15, in which the permanent magnet is formed with a samarium-cobalt magnet.

(Supplementary Note 17)
The magnetic force drive device according to any one of Supplementary notes 1 to 15, in which the permanent magnet is formed with a neodymium magnet.

(Supplementary Note 18)
The magnetic force drive device according to any one of Supplementary notes 1 to 17, in which the yoke is formed to contain a steel material.

(Supplementary Note 19)
The magnetic force drive device according to any one of Supplementary notes 1 to 17, in which the yoke is formed to contain a ferrite material.

(Supplementary Note 20)
The magnetic force drive device according to any one of Supplementary notes 1 to 17, in which the yoke is formed to contain a permalloy material.

(Supplementary Note 21)
An optical scanning device including:
the magnetic force drive device according to any one of Supplementary notes 1 to 20; and a mirror that is provided in the first movable part and reflects incident light.

(Supplementary Note 22)
The optical scanning device according to Supplementary note 21, in which:
the first movable part further has:
  a second movable part that has a second movable plate formed by a non-magnetic material;
  a second frame body that is fixed to the first movable plate and formed to surround a rim of the second movable part;
  a second pair of beam parts that connects between the second frame body and the second movable plate, and supports the second movable part so as to be able to rotate around a second axis that is substantially perpendicular to the first axis and that is substantially parallel to a main surface of the second movable plate; and
the mirror is provided in the second movable part.

(Supplementary Note 23)
The optical scanning device according to Supplementary note 22, further including a second driving unit that is connected to the second pair of beam parts and drives the second movable part.

(Supplementary Note 24)
The optical scanning device according to Supplementary note 23, in which the second driving unit has a piezoelectric material.

(Supplementary Note 25)
The optical scanning device according to any one of Supplementary notes 21 to 24, in which the mirror is formed by silver alloy.

(Supplementary Note 26)
The optical scanning device according to any one of Supplementary notes 21 to 24, in which the mirror is formed by aluminum alloy.

(Supplementary Note 27)
An image display device including:
a luminous flux generation device that generates a modulated luminous flux; and
the optical scanning device according to any one of Supplementary notes 21 to 26, that reflects and scans the luminous flux.

The present application is based on Japanese Patent Application No. 2010-067877, filed on Mar. 24, 2010, and the contents of Japanese Patent Application No. 2010-067877, including the specification, claims, and drawings, are entirely incorporated herein by reference.

Industrail Applicability

The present invention is suitable for use for image display devices such as projection-type displays.

DESCRIPTION OF REFERENCE NUMERALS

1 Image display device
4 Optical scanning device
5, 5A to 5G Optical scanning device 7, 7A to 7G Magnetic force drive device
8 External device
9 Screen
10 Luminous flux generation device
11 Signal processing circuit
12 Red laser
13 Green laser
14 Blue laser
15 Red laser driving circuit
16 Green laser driving circuit
17 Blue laser driving circuit
20 Collimated optical system
21, 22, 23 Collimator lens
30 Synthetic optical system
31, 32, 33 Dichroic mirror
40 Horizontal scanning unit
41 Optical scanning mirror
42 Horizontal scan driving circuit
43 Resonance frequency adjustment circuit
45 Horizontal scan synchronization circuit
50 Vertical scanning unit
51, 51G Optical scanning mirror (mirror)
52 Vertical scan driving circuit
55 Vertical scan synchronization circuit
100, 100G First movable part
111, 111B, 111G First movable plate
111a Hole part
112 First frame body
113 First pair of beam parts
120 Permanent magnet
200 First driving unit
210, 210C to 210F Yoke
211 First yoke unit
211a First end part
211b Opposite end part
211c, 211d Projection
212 Second yoke unit
212a Second end part
212b Opposite end part
213 Third yoke unit
213a Third end part
213b Opposite end part
214 Fourth yoke unit
220 Coil
230 Support part
231a Round hole
232A Spacer
300G Second movable part
311G Second movable plate
312G Second frame body
313G Second pair of beam parts
400G Second driving unit
410G Lower electrode
420G Piezoelectric element
430G Upper electrode

The invention claimed is:

1. A magnetic force drive device comprising:
a first movable part, having a first movable plate that is formed by a non-magnetic material, and a permanent magnet that is fixed to the first movable plate and magnetized in a direction that is substantially parallel to a main surface of the first movable plate;
a first frame body that is formed to surround a rim of the first movable part;
a first pair of beam parts that connects between the first frame body and the first movable plate, and that supports the first movable part to be able to rotate around a first axis, the first axis being substantially parallel to the main surface of the first movable plate and being substantially perpendicular to the direction in which the permanent magnet is magnetized; and
a first driving unit, having a yoke and a coil that magnetizes the yoke,
wherein
the yoke has a first yoke unit that has a first end part placed to face a surface of a permanent magnet, that has and a magnetic poles at two ends a second yoke unit that has a second end part placed to face one magnetic pole of the permanent magnet, and a third yoke that has a third end part placed to face an other magnetic pole of the permanent magnet,
the first yoke unit, the second yoke unit, and a third yoke unit are magnetically coupled with each and form one magnetic circuit,
the second end and the third ends are magnetized in the same polarity, and
the first end part and the second end part are magnetized in mutually different polarities so as to drive the first movable part in a same oscillation direction.

2. The magnetic force drive device according to claim 1, wherein
the first end part and the third end part are magnetized in mutually different polarities, so as to drive the first movable part in the same oscillation direction.

3. The magnetic force drive device according to claim 1, wherein at least one of the first and second end parts is formed sharp toward the permanent magnet.

4. The magnetic force drive device according to claim 1, wherein the first end part is formed to include a plurality of projections.

5. The magnetic force drive device according to claim 1, wherein
in the first movable plate, a hole part to place the permanent magnet is formed, and
the permanent magnet is placed in the hole part so that a center of gravity of the first movable part substantially matches the first axis.

6. The magnetic force drive device according to claim 1, wherein a stopper of a plate shape, formed by a non-magnetic material and limiting oscillation of the first movable part at a predetermined angle, is placed between the first end part and the first movable part.

7. An optical scanning device comprising:
the magnetic force drive device according to claim 1; and
a mirror that is provided in the first movable part and reflects incident light.

8. The magnetic force drive device according to claim 2, wherein at least one of the first, second and third end parts is formed sharp toward the permanent magnet.

9. The optical scanning device according to claim 7, wherein
the first movable part further has:
a second movable part that has a second movable plate formed by a non-magnetic material;
a second frame body that is fixed to the first movable plate and formed to surround a rim of the second movable part;
a second pair of beam parts that connects between the second frame body and the second movable plate, and supports the second movable part so as to be able to rotate around a second axis, the second axis being substantially perpendicular to the first axis and being substantially parallel to a main surface of the second movable plate, and
the mirror is provided in the second movable part.

10. An image display device comprising:
a luminous flux generation device that generates a modulated luminous flux; and
the optical scanning device according to claim 7, that reflects and scans the luminous flux.

* * * * *